United States Patent
Wu et al.

(10) Patent No.: US 11,329,160 B2
(45) Date of Patent: May 10, 2022

(54) FINFET GATE STRUCTURE

(71) Applicant: TAIWAN SEMICONDUCTOR MANUFACTURING CO., LTD., Hsinchu (TW)

(72) Inventors: Cheng-Ta Wu, Chiayi County (TW); Shiu-Ko Jangjian, Tainan (TW); Chung-Ren Sun, Kaohsiung (TW); Ming-Te Chen, Hsinchu County (TW); Ting-Chun Wang, Tainan (TW); Jun-Jie Cheng, Hualien County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/435,168

(22) Filed: Feb. 16, 2017

(65) Prior Publication Data
US 2017/0162395 A1  Jun. 8, 2017

Related U.S. Application Data

(62) Division of application No. 14/814,370, filed on Jul. 30, 2015, now Pat. No. 9,589,804.

(51) Int. Cl.
*H01L 29/78* (2006.01)
*H01L 21/762* (2006.01)
*H01L 29/66* (2006.01)

(52) U.S. Cl.
CPC ...... *H01L 29/785* (2013.01); *H01L 21/76224* (2013.01); *H01L 29/66795* (2013.01); *H01L 29/7851* (2013.01)

(58) Field of Classification Search
CPC ............ H01L 29/66795; H01L 29/7851
See application file for complete search history.

(56) References Cited

U.S. PATENT DOCUMENTS

| | | | |
|---|---|---|---|
| 2005/0145932 A1* | 7/2005 | Park | H01L 29/66795 257/328 |
| 2005/0250285 A1* | 11/2005 | Yoon | H01L 21/84 438/283 |
| 2006/0118876 A1* | 6/2006 | Lee | H01L 29/66795 257/365 |
| 2007/0020855 A1* | 1/2007 | Kim | H01L 29/66795 438/268 |
| 2013/0043563 A1 | 2/2013 | Nakazawa | |
| 2014/0191324 A1* | 7/2014 | Cai | H01L 29/66795 257/368 |

(Continued)

FOREIGN PATENT DOCUMENTS

EP    1566844 A2    8/2005

*Primary Examiner* — Trang Q Tran
(74) *Attorney, Agent, or Firm* — Maschoff Brennan

(57) ABSTRACT

A semiconductor device includes a semiconductor fin, a lining oxide layer, a silicon nitride based layer and a gate oxide layer. The semiconductor fin has a top fin surface, an upper fin side surface portion adjacent to the top fin surface, and a lower fin side surface contiguously connected to the upper fin side surface portion. The lining oxide layer peripherally encloses the lower fin side surface portion of the semiconductor fin. The silicon nitride based layer is disposed conformally over the lining oxide layer. The gate oxide layer is disposed conformally over the top fin surface and the upper fin side surface portion.

20 Claims, 6 Drawing Sheets

(56) References Cited

U.S. PATENT DOCUMENTS

| | | |
|---|---|---|
| 2014/0227856 A1 | 8/2014 | Park et al. |
| 2014/0315371 A1* | 10/2014 | Cai .................. H01L 21/76232 |
| | | 438/424 |
| 2014/0353795 A1 | 12/2014 | Tong et al. |
| 2015/0137263 A1* | 5/2015 | Lee ....................... H01L 29/785 |
| | | 257/401 |

* cited by examiner

FINFET GATE STRUCTURE

PRIORITY CLAIM AND CROSS-REFERENCE

This is a divisional application of U.S. patent application Ser. No. 14/814,370 filed on Jul. 30, 2015, which is incorporated herein by reference in its entirety.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, existing FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
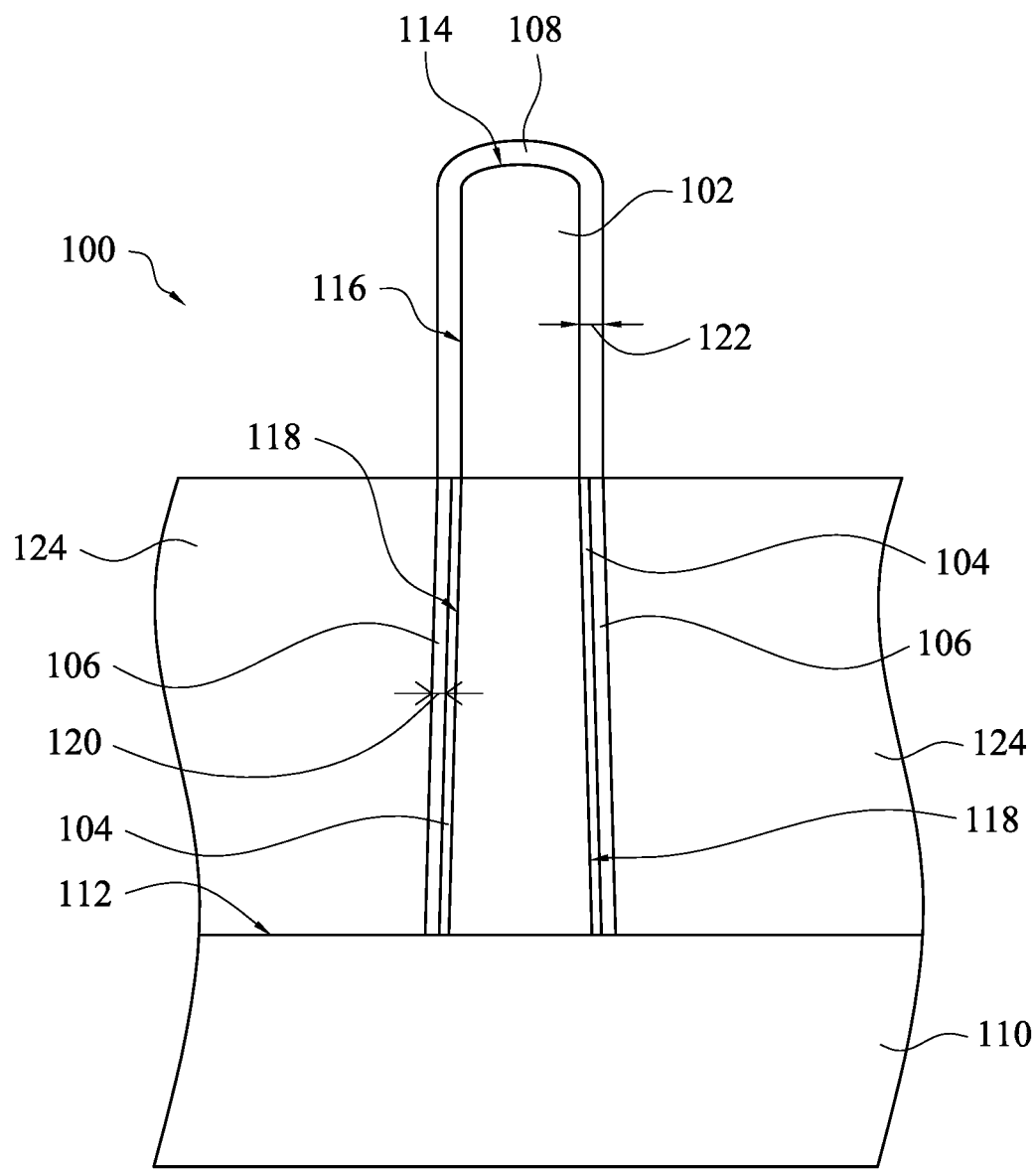
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a FinFET device, during a high temperature anneal process of an isolation oxide layer and a fin recess etching process, a semiconductor fin formed from silicon will suffer silicon consumption, thus resulting in a smaller critical dimension at a top of the semiconductor fin and a poor fin critical dimension uniformity, and degrading performance of the FinFET device. In addition, the semiconductor fin is likely to be damaged by thermal stress and/or a film stress. Furthermore, due to the silicon consumption of the semiconductor fin, a gate oxide layer has poor conformity to the semiconductor fin, and the gate oxide layer has a thinner thickness at a bottom portion of the semiconductor fin, and thus leakage is likely to occur at the bottom portion of the semiconductor fin.

Embodiments of the present disclosure are directed to providing a semiconductor device and a method for manufacturing the semiconductor device, in which a silicon nitride based layer is formed conformal to a lining oxide layer which is disposed conformal to a semiconductor fin. The silicon nitride based layer can prevent the semiconductor fin from being consumed during a subsequent high temperature anneal process performed on an isolation layer and a fin recess etching process, such that a critical dimension at a top of the semiconductor fin can be maintained and the critical dimension uniformity of the semiconductor fin can be increased, thereby enhancing performance of the semiconductor device. Furthermore, the silicon nitride based layer remains on a bottom portion of the semiconductor fin, and the silicon nitride based layer has greater structural strength than the lining oxide layer, thereby sustaining the semiconductor fin and resisting thermal stress and/or film stress. Moreover, the semiconductor fin is not consumed during the high temperature anneal process and the fin recess etching process, and the silicon nitride based layer is converted to form a gate oxide layer, such that the gate oxide layer may have good uniformity and conformity, thereby preventing the leakage of the semiconductor device, and further enhancing performance of the semiconductor device.

FIG. 1 is a schematic cross-sectional view of a semiconductor device in accordance with various embodiments. In some embodiments, a semiconductor device 100 is a FinFET device. As shown in FIG. 1, the semiconductor device 100 includes a semiconductor fin 102, a lining oxide layer 104, a silicon nitride based layer 106 and a gate oxide layer 108. In some examples, the semiconductor fin 102 is formed by recessing a semiconductor substrate 110, and thus the semiconductor fin 102 protrudes from a recessed surface 112 of the semiconductor substrate 110, and the semiconductor fin 102 and the semiconductor substrate 110 are formed from the same material. The semiconductor substrate 110 and the semiconductor fin 102 may be composed of a single-crystalline semiconductor material or a compound semiconductor material. For example, silicon, germanium or glass may be used as a material of the semiconductor substrate 110 and the semiconductor fin 102. In some exemplary examples, the semiconductor substrate 110 and the semiconductor fin 102 are composed of silicon.

Referring to FIG. 1 again, the semiconductor fin 102 has a top surface 114, a first side surface 116 and a second side surface 118. The top surface 114 is on the top of the semiconductor fin 102. The first side surface 116 is adjacent to and connected to the top surface 114, and peripherally encloses the top surface 114. The second side surface 118 is disposed under the first side surface 116, and is adjacent to and connected to the first side surface 116.

As shown in FIG. 1, the lining oxide layer 104 is disposed on the second side surface 118 of the semiconductor fin 102 to peripherally enclose the second side surface 118. The lining oxide layer 104 may be disposed conformal to the second side surface 118 of the semiconductor fin 102. In some examples, the lining oxide layer 104 includes a silicon oxide layer.

The silicon nitride based layer 106 is disposed on and conformal to the lining oxide layer 104, and peripherally encloses the lining oxide layer 104. In some examples, the silicon nitride based layer 106 includes a silicon nitride layer, a silicon oxynitride layer or a silicon oxycarbonitride layer. The silicon nitride based layer 106 has a thickness 120 ranging from about 20 angstrom to about 60 angstrom.

The gate oxide layer 108 is disposed on and conformal to the top surface 114 and the first side surface 116 of the semiconductor fin 102 to peripherally enclose the top surface 114 and the first side surface 116. In some examples, the gate oxide layer 108 includes a silicon dioxide layer. In certain examples, the gate oxide layer 108 has a thickness 122 equal to a combination of a thickness of the lining oxide layer 104 and the thickness 120 of the silicon nitride based layer 106.

In some examples, as shown in FIG. 1, the semiconductor device 100 further includes various trench isolation structures 124. The trench isolation structures 124 may peripherally enclose the silicon nitride based layer 106. For example, each of the trench isolation structures 124 may be a shallow trench isolation (STI) structure. In some examples, the trench isolation structures 124 include a dielectric layer, such as a silicon dioxide layer.

With the silicon nitride based layer 106 formed conformal to the lining oxide layer 104, the semiconductor fin 102 can be prevented from consuming during a high temperature anneal process performed on the trench isolation structures 124 and a recess etching process performed on the isolation layer for forming the trench isolation structures 124, such that a critical dimension at the top of the semiconductor fin 102 can be maintained and the critical dimension uniformity of the semiconductor fin 102 can be increased, thereby enhancing performance of the semiconductor device 100. In addition, the semiconductor fin 102 is not consumed during the high temperature anneal process and the fin recess etching process, and the silicon nitride based layer 106 is converted to form the gate oxide layer 108, such that the gate oxide layer 108 may have good uniformity and conformity, thereby preventing the leakage of the semiconductor device 100, and further enhancing performance of the semiconductor device 100. Furthermore, the silicon nitride based layer 106 remains on a bottom portion of the semiconductor fin 102, and the silicon nitride based layer 106 has greater structural strength than the lining oxide layer 104, such that the silicon nitride based layer 106 sustains the semiconductor fin 102 and resists thermal stress and/or film stress, thereby increasing process yield of the semiconductor device 100.

Figure 2A:
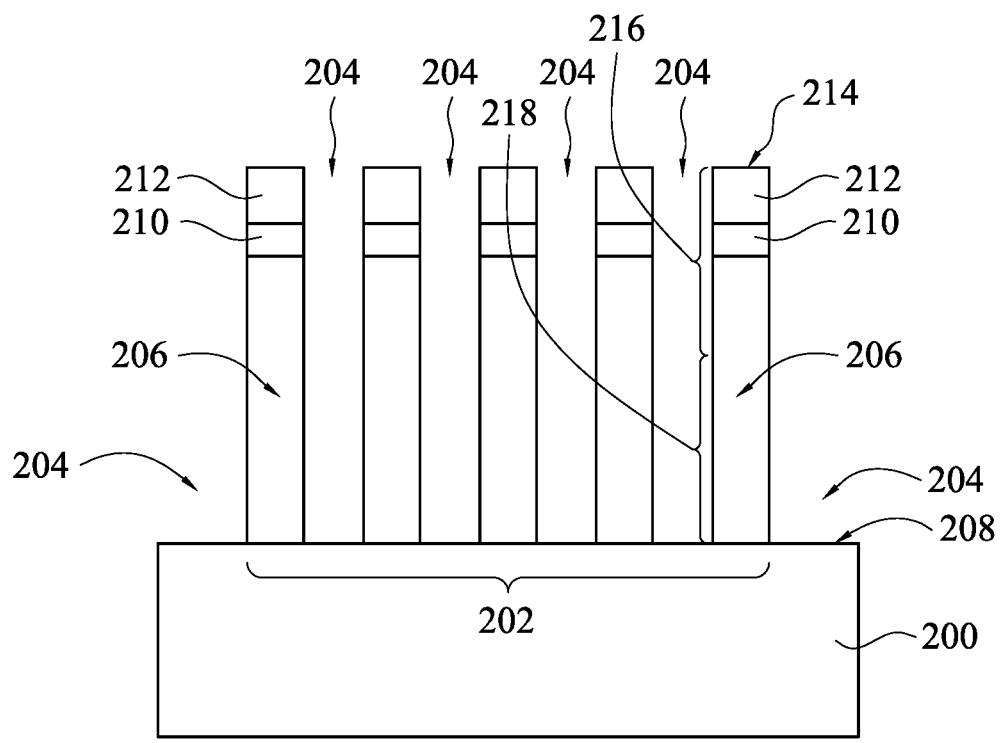
FIG. 2A through FIG. 2G are schematic cross-sectional views of intermediate stages showing a method for manufacturing a semiconductor device in accordance with various embodiments.

FIG. 2A through FIG. 2G are schematic cross-sectional views of intermediate stages showing a method for manufacturing a semiconductor device in accordance with various embodiments. As shown in FIG. 2A, a semiconductor substrate 200 is provided, and the semiconductor substrate 200 is recessed to define an active region 202 in the semiconductor substrate 200. In the operation of recessing the semiconductor substrate 200, a portion of the semiconductor substrate 200 is removed to form various isolation regions 204 in the semiconductor substrate 200 and at least one semiconductor fin 206 between the isolation regions 204 and over top surfaces 208 of the isolation regions 204. In some examples, as shown in FIG. 2A, various semiconductor fins 206 are formed in the operation of recessing the semiconductor substrate 200. In such examples, each of the semiconductor fins 206 is composed of a portion of the semiconductor substrate 200, such that the semiconductor fins 206 are formed from a material the same as that of the semiconductor substrate 200. The semiconductor substrate 200 and the semiconductor fins 206 may be composed of a single-crystalline semiconductor material or a compound semiconductor material. In some examples, silicon, germanium or glass may be used as a material of the semiconductor substrate 200 and the semiconductor fins 206. In some exemplary examples, the semiconductor substrate 200 and the semiconductor fins 206 are formed from silicon.

In certain examples, before the operation of recessing the semiconductor substrate 200, a pad oxide layer 210 and a hard mask layer 212 are blanketly formed on the semiconductor substrate 200 in sequence. For example, the pad oxide layer 210 may be formed using a thermal oxidation technique, and the hard mask layer 212 may be formed using a deposition technique, such as a chemical vapor deposition (CVD) technique. In some exemplary examples, the pad oxide layer 210 is formed to include a silicon oxide layer, and the hard mask layer 212 is formed to include a silicon nitride layer. As shown in FIG. 2A, the operation of recessing the semiconductor substrate 200 includes removing a portion of the hard mask layer 212, a portion of the pad oxide layer 210 and a portion of the semiconductor substrate 200 on the top surfaces 208 of the isolation regions 204. In such examples, each of the semiconductor fins 206 is composed of a portion of the semiconductor substrate 200, a portion of the pad oxide layer 214 and a portion of the hard mask layer 212 stacked sequentially.

Referring to FIG. 2A again, each of the semiconductor fins 206 has a top surface 214, a first side surface 216 and a second side surface 218. The top surface 214 is on the top of the semiconductor fin 206. The first side surface 216 is adjacent to and connected to the top surface 214, and peripherally encloses the top surface 214. The second side surface 218 is formed under the first side surface 216, and is adjacent to and connected to the first side surface 216.

Figure 2B:
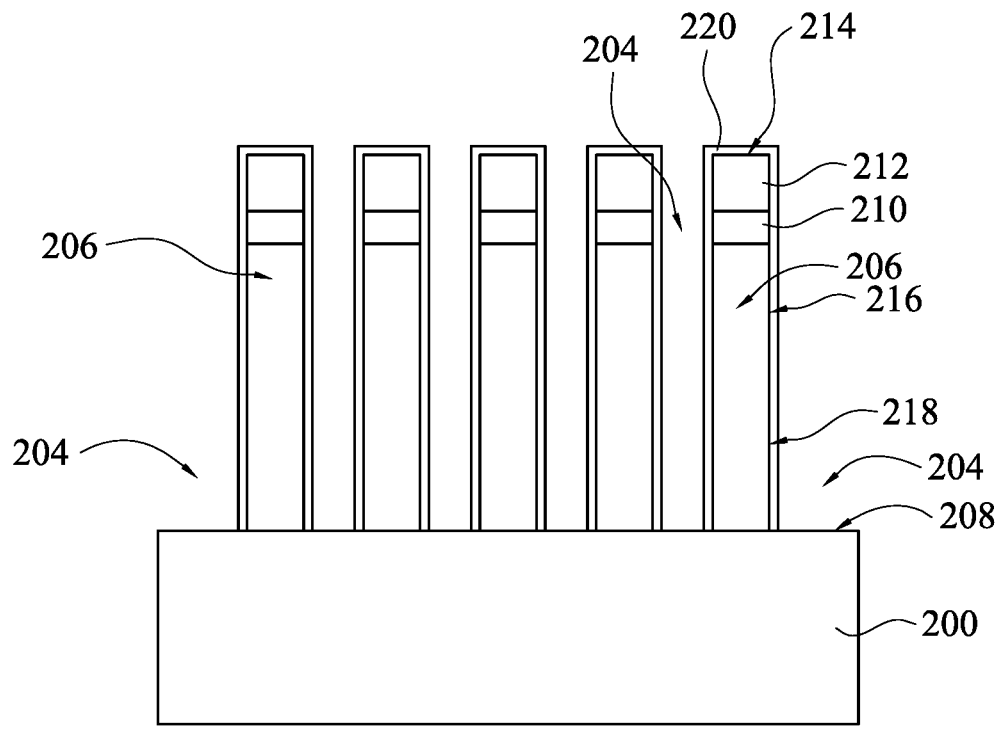

As shown in FIG. 2B, a lining oxide layer 220 is formed on the top surface 214, the first side surface 216 and the second side surface 218 of each semiconductor fin 206 and conformal to each semiconductor fin 206. In some examples, the operation of forming the lining oxide layer 220 is performed using a thermal oxidation technique. The operation of forming the lining oxide layer 220 may be performed using a deposition technique, such as a chemical vapor deposition technique. For example, the lining oxide layer 220 may be formed to include a silicon oxide layer.

Figure 2C:
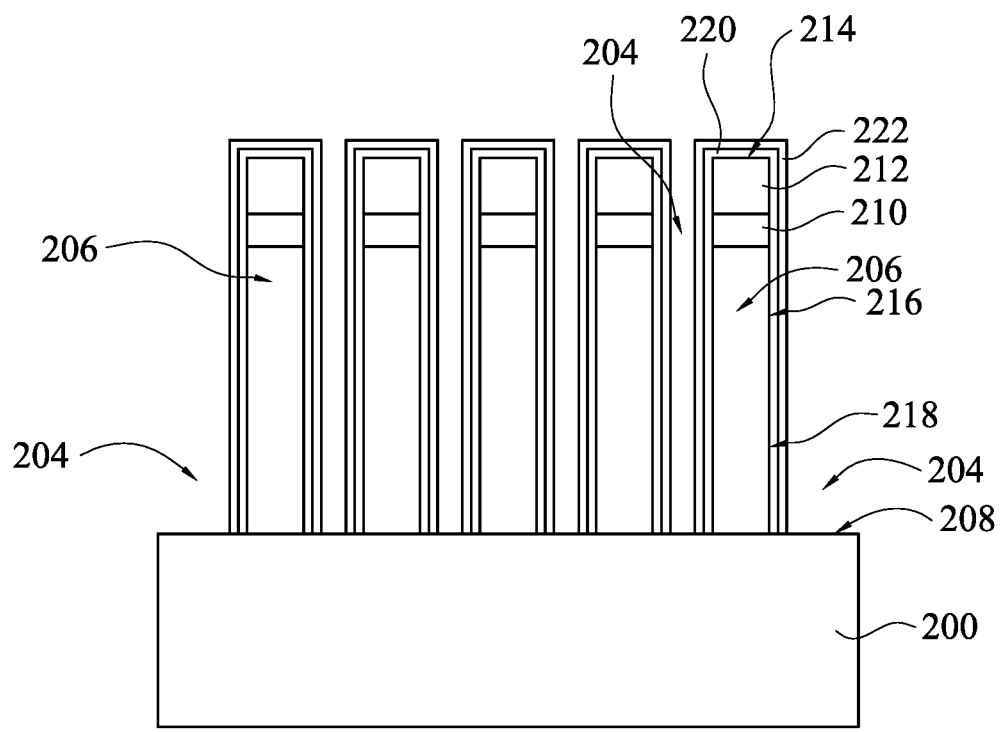

As shown in FIG. 2C, a silicon nitride based layer 222 is formed on the lining oxide layer 220 of each semiconductor fin 206 and conformal to the lining oxide layer 220. In some examples, the silicon nitride based layer 222 is formed to have a thickness ranging from about 20 angstrom to about 60 angstrom. For example, the operation of forming the silicon nitride based layer 222 may be performed using a low pressure chemical vapor deposition (LP-CVD) technique or an atomic layer deposition (ALD) technique. The operation of forming the silicon nitride based layer 222 may include forming the silicon nitride based layer 222 from silicon nitride, silicon oxynitride or silicon oxycarbonitride. For example, the operation of forming the silicon nitride based layer 222 may include introducing a reaction gas into a process chamber to form the silicon nitride based layer 222, in which the reaction gas may include $NH_3$, $N_2$, and $SiH_2Cl_2$ or $SiH_6$.

In some examples, the silicon nitride based layer 222 is formed from silicon nitride, and the operation of forming the silicon nitride based layer 222 includes introducing a reaction gas into the process chamber, in which the reaction gas includes about 30 sccm to about 500 sccm $SiH_2Cl_2$ and about 90 sccm to about 1500 sccm $NH_3$. In addition, the operation of forming the silicon nitride based layer 222 may further include controlling a process temperature of the process chamber between about 600 degrees centigrade and about 800 degrees centigrade, and controlling a process pressure of the process chamber between about 0.2 torr and about 100 torr.

In some examples, the silicon nitride based layer 222 is formed from silicon nitride, and the operation of forming the silicon nitride based layer 222 includes introducing a reaction gas into the process chamber, in which the reaction gas includes about 30 sccm to about 500 sccm $SiH_6$ and about 60 sccm to about 1200 sccm $NH_3$. The operation of forming the silicon nitride based layer 222 may further include controlling a process temperature of the process chamber between about 550 degrees centigrade and about 800 degrees centigrade, and controlling a process pressure of the process chamber between about 0.2 torr and about 100 torr.

In some examples, the silicon nitride based layer 222 is formed from silicon oxynitride, and the operation of forming the silicon nitride based layer 222 includes introducing a reaction gas into the process chamber, in which the reaction gas includes about 30 sccm to about 500 sccm $SiH_2Cl_2$, about 90 sccm to about 1500 sccm $NH_3$ and about 20 sccm to about 1000 sccm $N_2O$. The operation of forming the silicon nitride based layer 222 may further include controlling a process temperature of the process chamber between about 600 degrees centigrade and about 800 degrees centigrade, and controlling a process pressure of the process chamber between about 0.2 torr and about 100 torr.

In some examples, the silicon nitride based layer 222 is formed from silicon oxycarbonitride, and the operation of forming the silicon nitride based layer 222 includes introducing a reaction gas into the process chamber, in which the reaction gas comprises about 30 sccm to about 500 sccm $SiH_2Cl_2$, about 90 sccm to about 1500 sccm $NH_3$ and about 20 sccm to about 1000 sccm $CO_2$. The operation of forming the silicon nitride based layer 222 may further include controlling a process temperature of the process chamber between about 600 degrees centigrade and about 800 degrees centigrade, and controlling a process pressure of the process chamber between about 0.2 torr and about 100 torr.

Figure 2D:
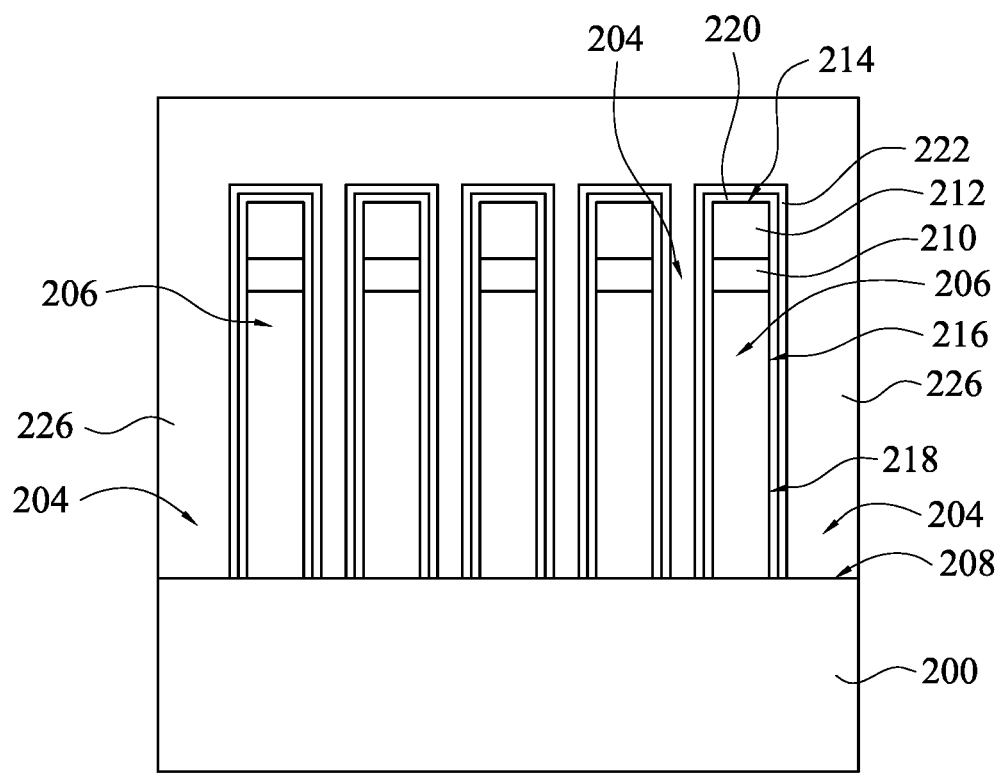
Figure 2E:
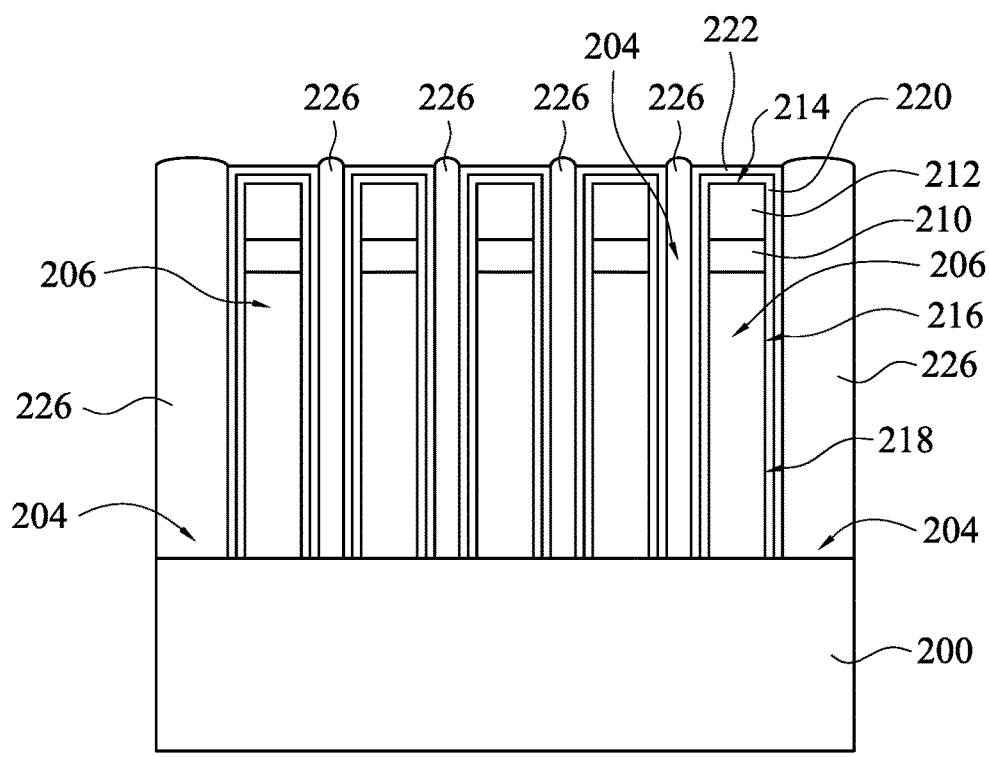
Figure 2F:
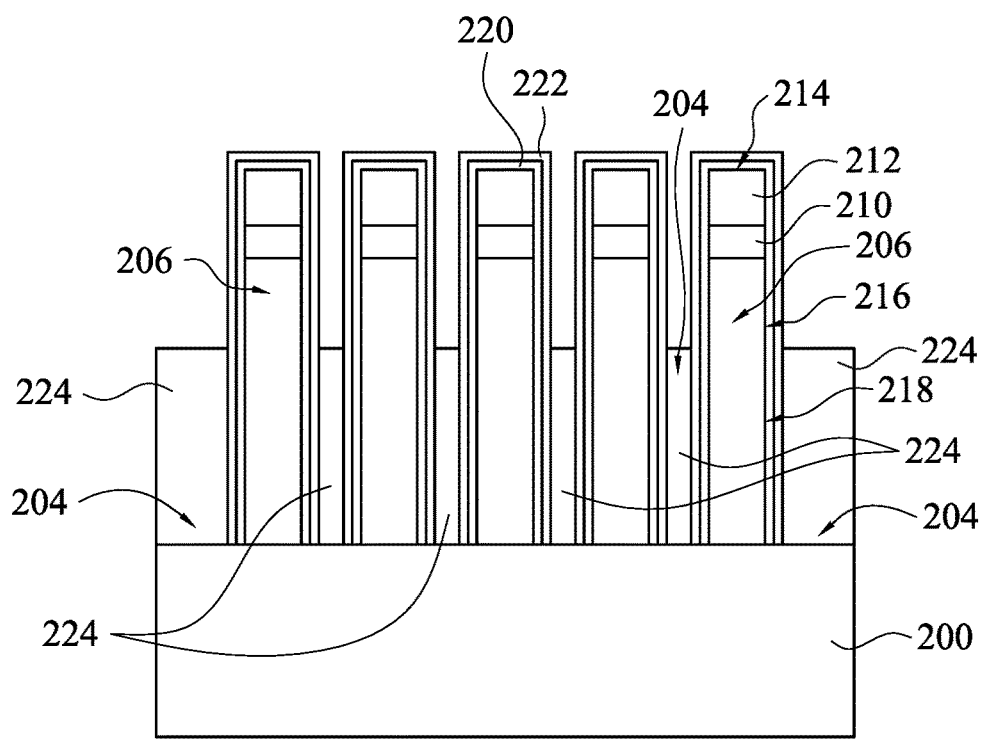

Referring to FIG. 2F firstly, various trench isolation structures 224 are formed on the isolation regions 204 to peripherally enclose the silicon nitride based layer 222 on the second side surface 218 of each of the semiconductor fins 206. In some examples, as shown in FIG. 2D, the operation of forming the trench isolation structures 224 includes forming an isolation layer 226 to cover the silicon nitride based layers 222 and to fill the isolation regions 204. The isolation layer 226 is formed to cover the semiconductor fins 206. For example, the operation of forming the isolation layer 226 may be performed using a chemical vapor deposition technique, such as a high-density plasma chemical vapor deposition (HDP-CVD) technique. In some exemplary examples, the isolation layer 226 is formed to include a silicon oxide layer.

After the operation of forming the isolation layer 226, an anneal operation may be optionally performed on the isolation layer 226 to densify the isolation layer 226. With the silicon nitride based layer 222 disposed conformal to the lining oxide layer 220, the silicon nitride based layer 222 can prevent each of the semiconductor fins 206 from consuming during the high temperature anneal operation performed on the isolation layer 226, such that a critical dimension at the top of each of the semiconductor fins 206 can be maintained, thereby increasing the critical dimension uniformity of the semiconductor fins 206.

As shown in FIG. 2E, the isolation layer 226 is planarized to expose the silicon nitride based layers 222 on the top surfaces 214 of the semiconductor fins 206. For example, the operation of planarizing the isolation layer 226 may be performed using a chemical mechanical polishing (CMP) technique. In some examples, after the operation of planarizing the isolation layer 226, various wells may be optionally formed into the semiconductor substrate 200 using an implanting technique.

As shown in FIG. 2F, the isolation layer 226 is recessed to form the trench isolation structures 224 on the isolation regions 204. The operation of recessing the isolation layer 226 may be performed using an etching technique, such as an anisotropic etching technique. The operation of recessing the isolation layer 226 includes removing a portion of the isolation layer 226 to expose the silicon nitride based layer 222 on the first side surface 216 of each of the semiconductor fins 206 and to form the trench isolation structures 224 to peripherally enclose the silicon nitride based layer 222 on the second side surface 218 of each of the semiconductor fins 206.

The silicon nitride based layer 222 disposed conformal to the lining oxide layer 220 can prevent each of the semiconductor fins 206 from consuming during the operation of recessing the isolation layer 226, such that the critical dimension at the top of each of the semiconductor fins 206 is effectively maintained, thereby further increasing the critical dimension uniformity of the semiconductor fins 206.

Figure 2G:
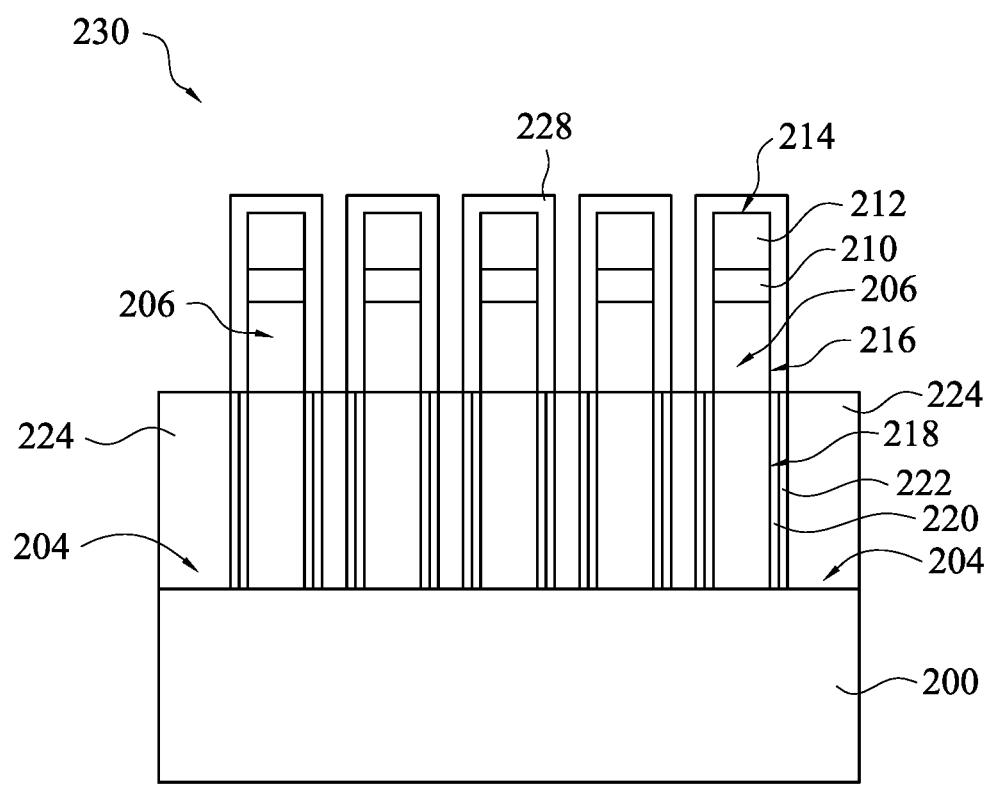

As shown in FIG. 2G, the silicon nitride based layer 222 on the top surface 214 and the first side surface 216 of each of the semiconductor fins 206 is converted into a gate oxide layer 228 to complete the formation of a semiconductor device 230. In some exemplary examples, the operation of converting the silicon nitride based layer 222 on the top surface 214 and the first side surface 216 of each semiconductor fin 206 into the gate oxide layer 228 includes converting the silicon nitride based layer 222 into silicon oxide. In some examples, the operation of converting the silicon nitride based layer 222 on the top surface 214 and the first side surface 216 of each semiconductor fin 206 into the gate oxide layer 228 includes introducing a reaction gas into the process chamber to form the gate oxide layer 228, in which the reaction gas includes $O_2$ and about 0.5 weight percent to about 33 weight percent $H_2$. The operation of converting the silicon nitride based layer 222 may further include controlling a process temperature of the process chamber between about 500 degrees centigrade and about 950 degrees centigrade, and controlling a process pressure of the process chamber between about 2 torr and about 100 torr. The operation of converting the silicon nitride based layer 222 may be performed by applying radio frequency electromagnetic energy at a microwave frequency to the process chamber.

In the operation of converting the silicon nitride based layer 222, $O_2$ of the reaction gas is dissociated into monatomic oxygen under the high process temperature, the silicon nitride based layer 222 on the top surface 214 and the first side surface 216 of each semiconductor fin 206 is re-oxidated by the monatomic oxygen, such that the silicon nitride based layer 222 is converted into a silicon oxide layer. While the silicon nitride based layer 222 is converted into the silicon oxide layer, the silicon oxide layer is integrated with the lining oxide layer 220 on the top surface 214 and the first side surface 216 of each semiconductor fin 206 to form the gate oxide layer 228 because the materials of both the silicon oxide layer and the lining oxide layer 220 are silicon oxide.

After the operation of converting the silicon nitride based layer 222 into the gate oxide layer 228, the silicon nitride based layer 222 remains on a bottom portion of each of the semiconductor fins 206, and the silicon nitride based layer 222 has greater structural strength than the lining oxide layer 220, such that the semiconductor fin 206 is sustained, and thermal stress and/or a film stress is resisted. Moreover, the semiconductor fin 206 is not consumed during the high temperature anneal operation and the recessing operation, and the silicon nitride based layer 222 is converted to form the gate oxide layer 228, such that the gate oxide layer 228 may have good uniformity and conformity, thereby preventing the leakage of the semiconductor device 230, and further enhancing performance of the semiconductor device 230.

Figure 3:
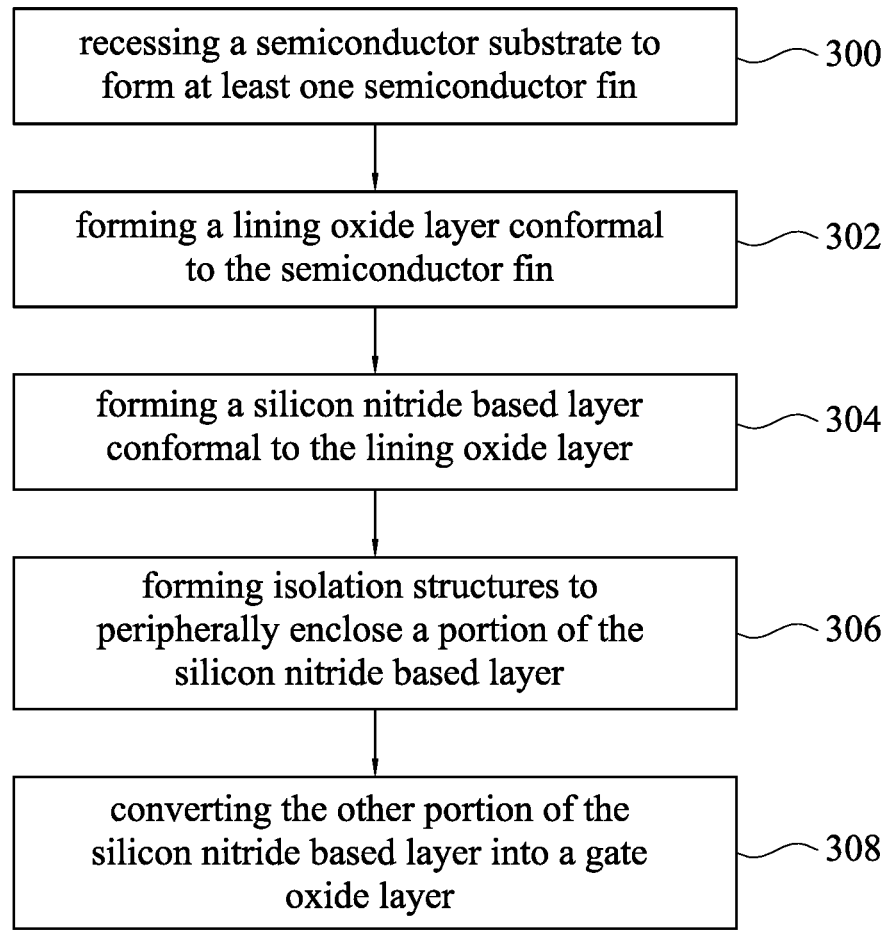
FIG. 3 is a flow chart of a method for manufacturing a semiconductor device in accordance with various embodiments.

Referring to FIG. 3 with FIG. 2A through FIG. 2G, FIG. 3 is a flow chart of a method for manufacturing a semiconductor device in accordance with various embodiments. The method begins at operation 300, where a semiconductor substrate 200 is recessed to define an active region 202 in the semiconductor substrate 200. As shown in FIG. 2A, the operation of recessing the semiconductor substrate 200 includes removing a portion of the semiconductor substrate 200 to form various isolation regions 204 in the semiconductor substrate 200 and at least one semiconductor fin 206 between the isolation regions 204 and over the top surfaces 208 of the isolation regions 204. In the examples shown in FIG. 2A, various semiconductor fins 206 are formed. In the examples, each semiconductor fin 206 is composed of a portion of the semiconductor substrate 200. The semiconductor substrate 200 and the semiconductor fins 206 may be composed of a single-crystalline semiconductor material or a compound semiconductor material. In some exemplary examples, the semiconductor substrate 200 and the semiconductor fins 206 are formed from silicon.

In certain examples, before the operation of recessing the semiconductor substrate 200, a pad oxide layer 210 and a hard mask layer 212 are blanketly formed on the semiconductor substrate 200 in sequence. The pad oxide layer 210 may be formed to include a silicon oxide layer using a thermal oxidation technique, and the hard mask layer 212 may be formed to include a silicon nitride layer using, for example, a chemical vapor deposition technique. As shown in FIG. 2A, the operation of recessing the semiconductor substrate 200 includes removing a portion of the hard mask layer 212, a portion of the pad oxide layer 210 and a portion of the semiconductor substrate 200 on the top surfaces 208 of the isolation regions 204. Thus, each of the semiconductor fins 206 is composed of a portion of the semiconductor substrate 200, a portion of the pad oxide layer 214 and a portion of the hard mask layer 212 stacked sequentially.

As shown in FIG. 2A, each of the semiconductor fins 206 has a top surface 214, a first side surface 216 and a second side surface 218. The top surface 214 is on the top of the semiconductor fin 206. The first side surface 216 is adjacent to and connected to the top surface 214 and peripherally encloses the top surface 214. The second side surface 218 is formed under, adjacent to and connected to the first side surface 216.

At operation 302, as shown in FIG. 2B, a lining oxide layer 220 is formed on the top surface 214, the first side surface 216 and the second side surface 218 of each semiconductor fin 206 and conformal to each semiconductor fin 206. The operation of forming the lining oxide layer 220 may be performed using a thermal oxidation technique or a deposition technique. In some exemplary examples, the lining oxide layer 220 is formed from silicon oxide.

At operation 304, as shown in FIG. 2C, a silicon nitride based layer 222 is formed on the lining oxide layer 220 of each semiconductor fin 206 and conformal to the lining oxide layer 220 using, for example, a low pressure chemical vapor deposition technique or an atomic layer deposition technique. In some examples, the silicon nitride based layer 222 is formed to have a thickness ranging from about 20 angstrom to about 60 angstrom. The silicon nitride based layer 222 may be formed from silicon nitride, silicon oxynitride or silicon oxycarbonitride. For example, the operation of forming the silicon nitride based layer 222 may include introducing a reaction gas into a process chamber to form the silicon nitride based layer 222, in which the reaction gas may include $NH_3$, $N_2$, and $SiH_2Cl_2$ or $SiH_6$.

In some examples, the silicon nitride based layer 222 is formed from silicon nitride, and the operation of forming the silicon nitride based layer 222 includes introducing a reaction gas into the process chamber, in which the reaction gas includes about 30 sccm to about 500 sccm $SiH_2Cl_2$ and about 90 sccm to about 1500 sccm $NH_3$. The operation of forming the silicon nitride based layer 222 may further include controlling a process temperature of the process chamber between about 600 degrees centigrade and about 800 degrees centigrade, and controlling a process pressure of the process chamber between about 0.2 torr and about 100 torr.

In some examples, the silicon nitride based layer 222 is formed from silicon nitride, and the operation of forming the silicon nitride based layer 222 includes introducing a reaction gas into the process chamber, in which the reaction gas includes about 30 sccm to about 500 sccm $SiH_6$ and about 60 sccm to about 1200 sccm $NH_3$. The operation of forming the silicon nitride based layer 222 may further include controlling a process temperature of the process chamber between about 550 degrees centigrade and about 800 degrees centigrade, and controlling a process pressure of the process chamber between about 0.2 torr and about 100 torr.

In some examples, the silicon nitride based layer 222 is formed from silicon oxynitride, and the operation of forming the silicon nitride based layer 222 includes introducing a reaction gas into the process chamber, in which the reaction gas includes about 30 sccm to about 500 sccm $SiH_2Cl_2$, about 90 sccm to about 1500 sccm $NH_3$ and about 20 sccm to about 1000 sccm $N_2O$. The operation of forming the silicon nitride based layer 222 may further include controlling a process temperature of the process chamber between about 600 degrees centigrade and about 800 degrees centigrade, and controlling a process pressure of the process chamber between about 0.2 torr and about 100 torr.

In some examples, the silicon nitride based layer 222 is formed from silicon oxycarbonitride, and the operation of forming the silicon nitride based layer 222 includes introducing a reaction gas into the process chamber, in which the reaction gas comprises about 30 sccm to about 500 sccm $SiH_2Cl_2$, about 90 sccm to about 1500 sccm $NH_3$ and about 20 sccm to about 1000 sccm $CO_2$. The operation of forming the silicon nitride based layer 222 may further include controlling a process temperature of the process chamber between about 600 degrees centigrade and about 800 degrees centigrade, and controlling a process pressure of the process chamber between about 0.2 torr and about 100 torr.

At operation 306, as shown in FIG. 2F, various trench isolation structures 224 are formed on the isolation regions 204 to peripherally enclose the silicon nitride based layer 222 on the second side surface 218 of each of the semiconductor fins 206. In some examples, as shown in FIG. 2D, the operation of forming the trench isolation structures 224 includes forming an isolation layer 226 to cover the silicon nitride based layers 222 and the semiconductor fins 206 and to fill the isolation regions 204 using, for example, a high-density plasma chemical vapor deposition technique. In some exemplary examples, the isolation layer 226 is formed from silicon oxide.

After the isolation layer 226 is formed, an anneal operation may be optionally performed on the isolation layer 226 to densify the isolation layer 226. As shown in FIG. 2E, the isolation layer 226 is planarized to expose the silicon nitride based layers 222 on the top surfaces 214 of the semiconductor fins 206 using, for example, a chemical mechanical polishing technique. In some examples, after the operation of planarizing the isolation layer 226, various wells may be optionally formed into the semiconductor substrate 200 using an implanting technique.

As shown in FIG. 2F, the isolation layer 226 is recessed to form the trench isolation structures 224 on the isolation regions 204 using, for example, an anisotropic etching technique. The operation of recessing the isolation layer 226 includes removing a portion of the isolation layer 226 to expose the silicon nitride based layer 222 on the first side surface 216 of each of the semiconductor fins 206 and to form the trench isolation structures 224 to peripherally enclose the silicon nitride based layer 222 on the second side surface 218 of each of the semiconductor fins 206.

At operation 308, as shown in FIG. 2G, the silicon nitride based layer 222 on the top surface 214 and the first side surface 216 of each semiconductor fin 206 is converted into a gate oxide layer 228 to complete the formation of a semiconductor device 230. In some exemplary examples, the operation of converting the silicon nitride based layer 222 includes converting the silicon nitride based layer 222 into silicon oxide. In some examples, the operation of converting the silicon nitride based layer 222 on the top surface 214 and the first side surface 216 of each semiconductor fin 206 includes introducing a reaction gas into the process chamber to form the gate oxide layer 228, in which the reaction gas includes $O_2$ and about 0.5 weight percent to about 33 weight percent $H_2$. The operation of converting the silicon nitride based layer 222 may further include controlling a process temperature of the process chamber between about 500 degrees centigrade and about 950 degrees centigrade, and controlling a process pressure of the process chamber between about 2 torr and about 100 torr. The operation of converting the silicon nitride based layer 222 may be performed by applying radio frequency electromagnetic energy at a microwave frequency to the process chamber.

In the operation of converting the silicon nitride based layer 222, $O_2$ of the reaction gas is dissociated into monatomic oxygen under the high process temperature, the silicon nitride based layer 222 exposed by the trench isolation structures 224 is re-oxidated by the monatomic oxygen, such that the silicon nitride based layer 222 is converted into a silicon oxide layer. While the silicon nitride based layer 222 is converted into the silicon oxide layer, the silicon oxide layer is integrated with the lining oxide layer 220 on the top surface 214 and the first side surface 216 of each semiconductor fin 206 to form the gate oxide layer 228.

In accordance with an embodiment, the present disclosure discloses a semiconductor device. The semiconductor device includes a semiconductor fin, a lining oxide layer, a silicon nitride based layer and a gate oxide layer. The semiconductor fin has a top fin surface, an upper fin side surface portion adjacent to the top fin surface, and a lower fin side surface portion under and contiguously connected to the upper fin side surface portion. The lining oxide layer peripherally encloses the lower fin side surface portion of the semiconductor fin. The silicon nitride based layer is disposed conformally over the lining oxide layer. The gate oxide layer is disposed conformally over the top fin surface and the upper fin side surface portion.

In accordance with another embodiment, the present disclosure discloses a semiconductor device. The semiconductor device includes a semiconductor fin, a lining oxide layer, a silicon nitride based layer, and an isolation structure. The semiconductor fin has a top fin surface, an upper fin side surface portion adjacent to the top fin surface, and a lower fin side surface portion continuously extending from under the upper fin side surface portion. The lining oxide layer peripherally encloses the lower fin side surface portion of the semiconductor fin. The silicon nitride based layer is disposed conformally over the lining oxide layer. The isolation structure peripherally encloses the silicon nitride based layer and embeds the lower fin side surface portion.

In accordance with yet another embodiment, the present disclosure discloses a semiconductor device. The semiconductor device includes a semiconductor fin, an isolation structure, a silicon nitride based layer, and a gate dielectric layer. The isolation structure peripherally encloses a bottom portion of the semiconductor fin. The silicon nitride based layer is disposed between the bottom portion of the semiconductor fin and the isolation structure. The gate dielectric layer extends contiguously from the silicon nitride based layer over a top portion of the semiconductor fin that exposed from the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor fin having a top fin surface, an upper fin side surface with a first end adjacent to the top fin surface, and a lower fin side surface connected to a second end of the upper fin side surface;
a lining oxide layer directly adjacent the lower fin side surface, and a topmost surface of the lining oxide layer is adjacent the second end of the upper fin side surface;
a silicon nitride based layer directly adjacent the lining oxide layer;
a gate oxide layer over the top fin surface, directly adjacent the upper fin side surface, and in contact with a top surface of the silicon nitride based layer, wherein a portion of the gate oxide layer has a thickness, in a first direction that is perpendicular to the upper fin side surface, greater than a thickness of the silicon nitride based layer in the first direction; and
an isolation structure directly adjacent the silicon nitride based layer, wherein the isolation structure is a single piece of continuous material, a topmost surface of the isolation structure, a topmost surface of the silicon nitride based layer, and the topmost surface of the lining oxide layer are substantially co-planar, and a bottommost surface of the isolation structure, a bottommost surface of the silicon nitride based layer, and a bottommost surface of the lining oxide layer are substantially co-planar.

2. The semiconductor device of claim 1, wherein the gate oxide layer is made essentially of silicon oxide.

3. A semiconductor device, comprising:
a substrate;
a first semiconductor fin above the substrate, having a top fin surface, an upper fin side surface portion adjacent to the top fin surface, and a lower fin side surface portion continuously extending from under the upper fin side surface portion;
a second semiconductor fin above the substrate and spaced apart from the first semiconductor fin;
a lining oxide layer directly adjacent the lower fin side surface portion of the first semiconductor fin;
a silicon nitride based layer directly adjacent the lining oxide layer;
a first gate dielectric layer covering the top fin surface and the upper fin side surface portion of the first semiconductor fin;
a second gate dielectric layer covering the second semiconductor fin and spaced apart from the first gate dielectric layer; and
an isolation structure directly adjacent the silicon nitride based layer and embedding the lower fin side surface portion, wherein a bottom surface of the isolation structure is in direct contact with the substrate, a topmost surface of the isolation structure is higher than a bottommost surface of the silicon nitride based layer, the isolation structure is a single piece of continuous material, and the topmost surface of the isolation structure and a topmost surface of the silicon nitride based layer are substantially co-planar.

4. The semiconductor device of claim 3, wherein the first gate dielectric layer is connected to the lining oxide layer and the silicon nitride based layer.

5. The semiconductor device of claim 4, wherein the first gate dielectric layer extends continuously from the silicon nitride based layer.

6. A semiconductor device, comprising:
a substrate;
a semiconductor fin above the substrate that has a sidewall;
a lining oxide layer directly adjacent a bottom portion of the sidewall of the semiconductor fin;
a silicon nitride based layer directly adjacent the lining oxide layer;
an isolation structure directly adjacent the silicon nitride based layer, wherein the substrate and the isolation structure are free of the silicon nitride based layer therebetween, and a bottom surface of the isolation structure, a bottom surface of the silicon nitride based layer, and a bottom surface of the lining oxide layer are substantially co-planar, and the isolation structure and the silicon nitride based layer comprise different materials; and
a gate dielectric layer extending contiguously from the silicon nitride based layer over a top portion of the semiconductor fin that exposed from the isolation structure, wherein a portion of the gate dielectric layer on the sidewall of the semiconductor fin has a thickness, in a first direction that is perpendicular to the sidewall of the semiconductor fin, greater than a thickness of the lining oxide layer in the first direction.

7. The semiconductor device of claim 6, wherein the gate dielectric layer is made essentially of silicon oxide.

8. The semiconductor device of claim 6, wherein the lining oxide layer is disposed between the bottom portion of the semiconductor fin and the silicon nitride based layer.

9. The semiconductor device of claim 1, further comprising a substrate below the semiconductor fin, wherein the substrate and the isolation structure are free of the silicon nitride based layer therebetween.

10. The semiconductor device of claim 1, further comprising a substrate below the semiconductor fin, wherein the substrate and the isolation structure are free of the lining oxide layer therebetween.

11. The semiconductor device of claim 1, wherein the lining oxide layer is spaced apart from the isolation structure.

12. The semiconductor device of claim 3, wherein the bottommost surface of the silicon nitride based layer, a bottommost surface of the lining oxide layer, and a bottommost surface of the isolation structure are in direct contact with the substrate.

13. The semiconductor device of claim 3, wherein the isolation structure is separated from the lining oxide layer by the silicon nitride based layer.

14. The semiconductor device of claim 3, wherein the silicon nitride based layer is in direct contact with the substrate.

15. The semiconductor device of claim 6, wherein a top surface of the isolation structure and a top surface of the silicon nitride based layer are substantially co-planar.

16. The semiconductor device of claim 1, wherein the silicon nitride based layer and the isolation structure comprise different materials.

17. The semiconductor device of claim 1, wherein the silicon nitride based layer is in direct contact with a substrate.

18. The semiconductor device of claim 3, wherein the isolation structure and the silicon nitride based layer comprise different materials.

19. The semiconductor device of claim 3, wherein the second gate dielectric layer does not cover the topmost surface of the isolation structure.

20. The semiconductor device of claim 3, wherein the isolation structure is spaced apart from the second semiconductor fin.

\* \* \* \* \*